(12) United States Patent
Cheng et al.

(10) Patent No.: US 10,522,584 B2
(45) Date of Patent: Dec. 31, 2019

(54) DISPLAY PANEL, MANUFACTURING METHOD THEREOF AND DISPLAY DEVICE

(71) Applicant: Shanghai Tianma AM-OLED Co., Ltd., Shanghai (CN)

(72) Inventors: Shuang Cheng, Shanghai (CN); Jinghua Niu, Shanghai (CN); Xiangcheng Wang, Shanghai (CN); Qing Zhu, Shanghai (CN); Honghu Ma, Shanghai (CN); Jun Lin, Shanghai (CN); Yinhe Liu, Shanghai (CN)

(73) Assignee: Shanghai Tianma AM-OLED Co., Ltd., Shanghai (CN)

(*) Notice: Subject to any disclaimer, the term of this patent is extended or adjusted under 35 U.S.C. 154(b) by 0 days.

(21) Appl. No.: 16/175,997

(22) Filed: Oct. 31, 2018

(65) Prior Publication Data
US 2019/0280040 A1 Sep. 12, 2019

(51) Int. Cl.
*H01L 31/173* (2006.01)
*H01L 27/146* (2006.01)
(Continued)

(52) U.S. Cl.
CPC ...... *H01L 27/14678* (2013.01); *G06K 9/0004* (2013.01); *H01L 27/14623* (2013.01); *H01L 27/14685* (2013.01); *H01L 27/156* (2013.01); *H01L 33/005* (2013.01); *H01L 31/022408* (2013.01); *H01L 31/125* (2013.01); *H01L 33/0008* (2013.01); *H01L 33/0079* (2013.01);
(Continued)

(58) Field of Classification Search
CPC ....... H01L 27/15; H01L 33/48; H01L 31/125; H01L 33/0008; H01L 33/0079; G06K 9/0004
See application file for complete search history.

(56) References Cited

U.S. PATENT DOCUMENTS

| | | | |
|---|---|---|---|
| 2006/0115128 A1* | 6/2006 | Mainguet | G06K 9/00026 382/115 |
| 2009/0141004 A1* | 6/2009 | Yamazaki | G06F 3/0412 345/175 |

(Continued)

FOREIGN PATENT DOCUMENTS

| | | |
|---|---|---|
| CN | 106873063 A | 6/2017 |
| KR | 20130050662 A | 5/2013 |

*Primary Examiner* — George R Fourson, III
(74) *Attorney, Agent, or Firm* — Miller, Matthias & Hull LLP

(57) ABSTRACT

Provided are a display panel, a manufacturing method thereof and a display device. The display panel includes: a first substrate and a second substrate disposed opposite to each other, and a plurality of light-emitting units and a plurality of fingerprint identification units, disposed on one side of the first substrate facing to the second substrate. Each of the plurality of light-emitting units includes a first N-type semiconductor layer and a first P-type semiconductor layer, each of the plurality of fingerprint identification units includes a second N-type semiconductor layer and a second P-type semiconductor layer. The first N-type semiconductor layer and the second N-type semiconductor layer are disposed in a same layer, and the first P-type semiconductor layer and the second P-type semiconductor layer are disposed in a same layer.

20 Claims, 12 Drawing Sheets

(51) Int. Cl.
  *G06K 9/00*   (2006.01)
  *H01L 27/15*  (2006.01)
  *H01L 33/00*  (2010.01)
  H01L 31/0224  (2006.01)
  H01L 33/10    (2010.01)
  H01L 33/36    (2010.01)
  H01L 33/48    (2010.01)
  H01L 31/12    (2006.01)

(52) U.S. Cl.
  CPC ............ *H01L 33/105* (2013.01); *H01L 33/36* (2013.01); *H01L 33/48* (2013.01); *H01L 2933/0016* (2013.01)

(56) References Cited

U.S. PATENT DOCUMENTS

| | | | |
|---|---|---|---|
| 2017/0221972 A1* | 8/2017 | Yang | G06K 9/0004 |
| 2017/0365588 A1* | 12/2017 | Chen | H01L 25/0753 |
| 2019/0034020 A1* | 1/2019 | He | G02F 1/13338 |
| 2019/0065813 A1* | 2/2019 | Xu | G06K 9/0004 |
| 2019/0294852 A1* | 9/2019 | Vogel | G06K 9/00087 |

\* cited by examiner

DISPLAY PANEL, MANUFACTURING METHOD THEREOF AND DISPLAY DEVICE

CROSS-REFERENCES TO RELATED APPLICATIONS

This application claims priority to a Chinese patent application No. 201810201260.3 filed on Mar. 12, 2018, disclosure of which is incorporated herein by reference in its entirety.

TECHNICAL FIELD

The present disclosure relates to display technologies and, in particular, to a display panel, a manufacturing method thereof and a display device.

BACKGROUND

Everyone's dermatoglyph (including a fingerprint) is different from a pattern, a breakpoint and an intersection standpoint, showing uniqueness and remaining unchanged throughout life. In view of the above contents, we can identify a person with his fingerprints to verify his real identity by comparing his fingerprints with a pre-stored fingerprint data, and that is the fingerprint recognition technology. Thanks to electronic integrated manufacturing technologies and fast and reliable algorithm researches, an optical fingerprint recognition technology in the fingerprint recognition space has begun to enter into our daily life and has becomes a technology which is researched in-depth, widely applied and developed in biological detection.

At present, the optical fingerprint identification technology is usually combined with display technologies, so that a display panel not only has a normal display function, but also can carry out fingerprint identification. Therefore, functions of the display panel have been enriched and the security performance of the display panel is improved. To implement the fingerprint identification function of the display panel, an external fingerprint identification unit is usually disposed in the existing display panel. The external fingerprint identification unit is adhered to the base substrate of the display panel with optical cement. In other words, in the existing display panel, each light-emitting unit and each fingerprint identification unit are sequentially arranged in a direction perpendicular to the plane where a first substrate is located. As a result the display panel has a large overall thickness, which is not advantageous to achieve the lightening and thinning of the display panel.

SUMMARY

The present disclosure provides a display panel, a manufacturing method thereof and a display device to reduce the overall thickness of the display panel and facilitate the lightening and thinning of the display panel.

In a first aspect, an embodiment of the present disclosure provides a display panel. The display panel includes: a first substrate and a second substrate disposed opposite to each other; and a plurality of light-emitting units and a plurality of fingerprint identification units, disposed on one side of the first substrate facing the second substrate. Each of the plurality of light-emitting units includes a first N-type semiconductor layer and a first P-type semiconductor layer, each of the plurality of fingerprint identification units includes a second N-type semiconductor layer and a second P-type semiconductor layer, the first N-type semiconductor layer and the second N-type semiconductor layer are disposed in a same layer, and the first P-type semiconductor layer and the second P-type semiconductor layer are disposed in a same layer.

In a second aspect, an embodiment of the present disclosure further provides a manufacturing method of a display panel. The manufacturing method includes the following steps: providing a first substrate, and forming a plurality of light-emitting units and a plurality of fingerprint identification units on the first substrate, where each of the plurality of light-emitting units includes a first N-type semiconductor layer and a first P-type semiconductor layer, each of the plurality of fingerprint identification units includes a second N-type semiconductor layer and a second P-type semiconductor layer, the first N-type semiconductor layer and the second N-type semiconductor layer are formed in a same film layer, and the first P-type semiconductor layer and the second P-type semiconductor layer are formed in a same film layer.

In a third aspect, an embodiment of the present disclosure further provides a display device including the display panel provided in the first aspect.

DETAILED DESCRIPTION

Figure 1:
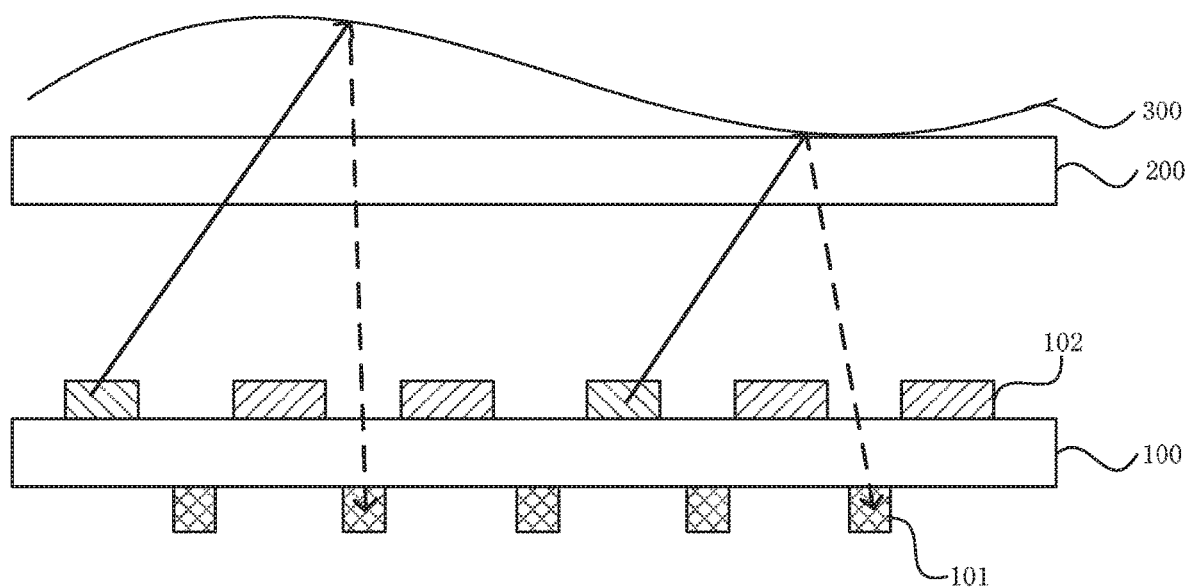
FIG. 1 is a structural diagram of a display panel in a related art.

The present disclosure will be further described in detail in conjunction with the drawings and embodiments. It should be understood that the specific embodiments set forth below are intended to illustrate and not to limit the present disclosure. Additionally, it is to be noted that to facilitate description, only part, not all, of structures related to the present disclosure are illustrated in the drawings.

It should be noted that, in the present disclosure, a fingerprint identification unit mentioned herein needs to be combined with a fingerprint identification light source to implement a fingerprint identification function. In the drawings of the present disclosure, light directly emitted by the fingerprint identification light source is indicated by a bold solid line, and reflected light formed after being reflected by a touch body is indicated by a bold dotted line.

FIG. 1 is a structural diagram of a display panel in a related art. Referring to FIG. 1, a display panel includes: a first substrate 100 and a second substrate 200 disposed opposite to each other. A light-emitting unit 102 is disposed on one side of the first substrate 100 facing to the second substrate 200. A fingerprint identification unit 101 is disposed on one side of the first substrate 100 facing away from the substrate 200. The light-emitting unit 102 is employed as a fingerprint identification light source of the fingerprint identification unit 101. Light emitted by the light-emitting unit 102 is reflected by a touch body 300 and transmitted into the fingerprint identification unit 101. The fingerprint identification unit 101 detects an intensity of the reflected light to implement a fingerprint identification function of the display panel. In this structure, the fingerprint identification unit 101 is an external fingerprint identification unit and adhered to the first substrate 100 of the display panel with optical cement (not shown in FIG. 1), which increases an overall thickness of the display panel and does not facilitate lightening and thinning of the display panel.

To solve the problem, the embodiments of the present disclosure provide a display panel to reduce the overall thickness of the display panel and achieve the lightening and thinning of the display panel.

Figure 2:
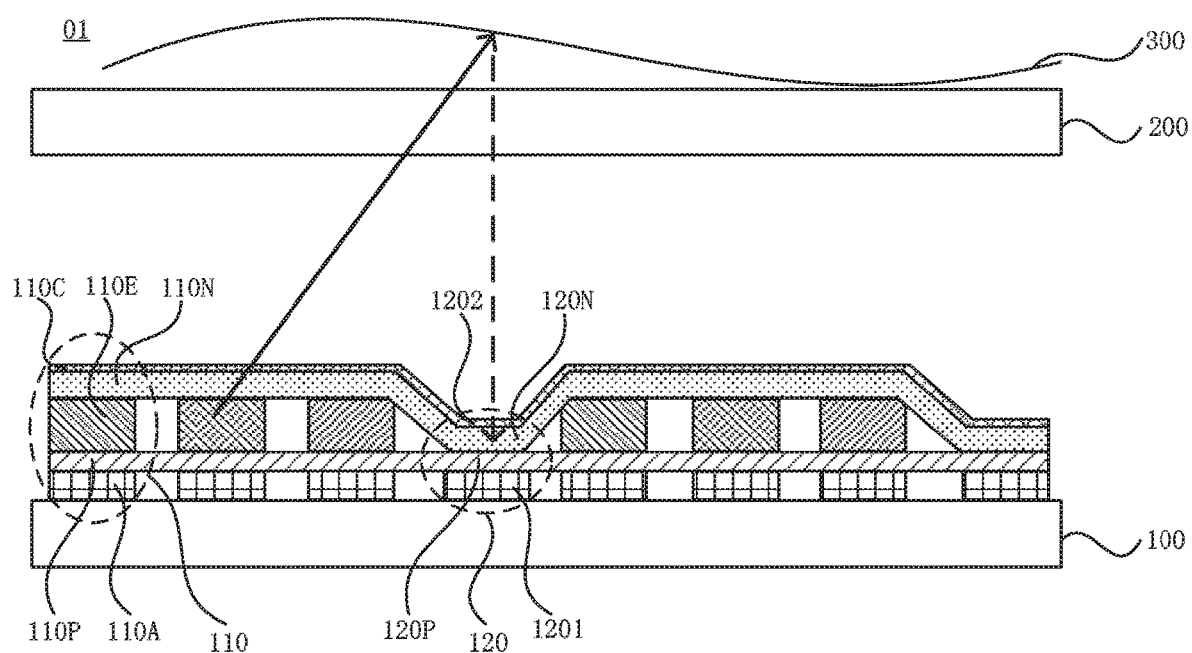
FIG. 2 is a structural diagram of a display panel according to an embodiment of the present disclosure.

FIG. 2 is a structural diagram of a display panel according to an embodiment of the present disclosure. Referring to FIG. 2, a display panel 01 includes: a first substrate 100 and a second substrate 200 disposed opposite to each other, and a plurality of light-emitting units 110 and a plurality of fingerprint identification units 120, disposed on one side of the first substrate 100 facing to the second substrate 200. Each of the plurality of light-emitting units 110 includes a first N-type semiconductor layer 110N and a first P-type semiconductor layer 110P, each of the plurality of fingerprint identification units 120 includes a second N-type semiconductor layer 120N and a second P-type semiconductor layer 120P. The first N-type semiconductor layer 110N and the second N-type semiconductor layer 120N are disposed in a same layer and the first P-type semiconductor layer 110P and the second P-type semiconductor layer 120P are disposed in a same layer.

Referring to FIG. 2, the second N-type semiconductor layer 120N and the second P-type semiconductor layer 120P form a PN junction together. That is, the fingerprint identification unit 120 is essentially a photosensitive diode having a photosensitive property and unidirectional conductivity. In the case of no light, the PN junction has a small reverse saturation leakage current, i.e., a dark current. In this case, the PN junction is turned off. In case of light exposure, the PN junction has a greatly increased reverse saturation leakage current which forms a light current. The light current varies with an intensity of incident light and thus a touch body may be identified.

In the embodiments of the present disclosure, the first P-type semiconductor 110P of the light-emitting unit 110 is disposed in a same layer as the second P-type semiconductor 120P of the fingerprint identification unit 120 and the first N-type semiconductor 110N of the light-emitting unit 110 is disposed in a same layer as the second N-type semiconductor 120N of the fingerprint identification unit 120, so that each light-emitting unit and each fingerprint identification unit are sequentially arranged on the plane where the first substrate is located rather than that each light-emitting unit and each fingerprint identification unit are sequentially arranged in a direction perpendicular to the plane where the first substrate is located. That is, it is unnecessary to separately dispose the fingerprint identification unit 120 outside the film layer of the light-emitting unit 110, which solves the problem that an existing display panel employs an external fingerprint identification unit so that the overall thickness of the display panel is great and does not facilitate the lightening and thinning of the display panel, and achieves the reduction on the overall thickness of the display panel and facilitates the lightening and thinning of the display panel.

In one embodiment, the first N-type semiconductor layer 110N and the second N-type semiconductor layer 120N are formed in a same process by using same materials. Compared with the scheme in which the first N-type semiconductor layer 110N and the second N-type semiconductor layer 120N are separately formed in different processes, such an arrangement only requires one etching process in the fabrication process, and masks are not separately needed for the first N-type semiconductor layer 110N and the second N-type semiconductor layer 120N, which saves costs, reduces the number of processes and improves fabrication efficiency.

In one embodiment, the first P-type semiconductor layer 110P and the second P-type semiconductor layer 120P are formed in a same process by using same materials. Compared with the scheme in which the first P-type semiconductor layer the 110P and the second P-type semiconductor layer 120P are separately formed in different processes, such an arrangement only requires one etching process in the fabrication process, and masks are not separately needed for the first P-type semiconductor layer 110P and the second P-type semiconductor layer 120P, which saves costs, reduces the number of processes and improves fabrication efficiency.

It should be noted that, in FIG. 2, the display panel includes two repetitive units. One repetitive unit includes three adjacent light-emitting units 110 and one fingerprint identification unit 120. The display panel includes six light-emitting units 110 and two fingerprint identification units 120 in total. This is only a specific embodiment of the present application and not a limit to the present application. In practice, the number and arrangement of the light-emitting unit 110 and the fingerprint identification unit 120 in the display panel may be set according to practical needs.

Still referring to FIG. 2, each of the plurality of light-emitting units 110 further includes an anode 110A, a first light-emitting layer 110E and a cathode 110C which are sequentially stacked. The first P-type semiconductor layer 110P is disposed between the anode 110A and the first light-emitting layer 110E, the first N-type semiconductor layer 110N is disposed between the first light-emitting layer 110E and the cathode 110C, and the anode 110A is disposed between the first substrate 100 and the first light-emitting layer 110E.

When an image display is performed, a driving voltage is applied to the anode 110A and the cathode 110C of the light-emitting unit 110. Under the action of the driving voltage, an electric field is generated between the cathode 110C and the anode 110A, causing electrons to be transmitted from the cathode 110C to the first light-emitting layer 110E and holes to be transmitted from the anode 110A to the first light-emitting layer 110E. The electrons and the holes meet in the first light-emitting layer 110E and are bound together due to the Coulomb force, thus forming excitons in an excited state. Since the excitons in the excited state are unstable, the excitons transfer a part of energy to luminescent molecules in the first light-emitting layer 110E, causing electrons in the luminescent molecules to transit from a ground state to an excited state, and another part of energy is released by heat or in another form, i.e., energy losses. The electrons in the excited state in the luminescent molecules are unstable and a radiative transition occurs, that is, the electrons release energy and return to the ground state. In the radiative transition, photons are generated, that is, the light-emitting unit 110 emits light.

The first P-type semiconductor layer 110P and the first N-type semiconductor layer 110N may reduce an interface potential barrier in the transmission of electrons and holes, thereby improving injection capabilities of carriers (electrons and holes) in the light-emitting unit and further improving light-emitting efficiency of the light-emitting unit 110.

Referring to FIG. 2, in the above technical solution, the anode 110A is disposed between the first substrate 100 and the first light-emitting layer 110E. This is only a specific embodiment and not a limit to the present application. Optionally, the cathode 110C may be disposed between the first substrate 100 and the first light-emitting layer 110E.

In the above technical solution, if the first light-emitting layer 110E includes different light-emitting materials, a corresponding light-emitting unit 110 may emit different colors of light.

Exemplarily, the materials of the first light-emitting layer 110E may be red light-emitting materials, green light-emitting materials or blue light-emitting materials.

Still referring to FIG. 2, each of the plurality of fingerprint identification units 120 may further include a first electrode 1201 and a second electrode 1202. The first electrode 1201 is disposed on one side of the second P-type semiconductor layer 120P facing away from the second N-type semiconductor layer 120N and the second electrode 1202 is disposed on one side of the second N-type semiconductor layer 120N facing away from the second P-type semiconductor layer 120P.

At this time, the overall structure of the fingerprint identification unit 120 is similar to a structure of an organic photovoltaic cell and may implement the fingerprint identification function with a photo-generated carrier effect. Exemplarily, the fingerprint identification unit 120 employs an optical fingerprint identification manner. In such a manner, light reflected by different positions of a fingerprint of a touch body 300 is incident into the fingerprint identification unit 120 and light reflected by the fingerprint is received by the fingerprint identification unit 120 to generate an electrical signal related to the fingerprint. Due to an uneven texture on the fingerprint, the intensities of light reflected by different positions of the fingerprint are different and thus the intensities of light received by different fingerprint identification units 120 are different. Under different light intensities, electrical signals fed back by a charge generation layer (CGL) including the second P-type semiconductor layer 120P and the second N-type semiconductor layer 120N are different. Therefore, the electrical signals fed back by each fingerprint identification unit 120 reflect fingerprint features of the touch body 300, thereby implementing the fingerprint identification function of the display panel 01.

Exemplarily, the electrical signals fed back by the charge generation layer may be voltage signals or current signals.

Exemplarily, in FIG. 2, the first electrodes 1201 of the plurality of fingerprint identification units 120 are discrete and the second electrodes 1202 of the plurality of fingerprint identification units 120 are continuous. Here, that the second electrodes 1202 are continuous means that the second electrodes 1202 of the plurality of fingerprint recognition units 120 are electrically connected to each other, and thus the electric signals may be fed back by the first electrodes 1201.

It is to be noted that FIG. 2 only exemplarily shows a case where the first electrodes 1201 are discrete and the second electrodes 1202 are continuous, but this is not a limit to this embodiment. In another embodiment, it may be set that the first electrodes 1201 are continuous and the second electrodes 1202 are discrete. It may also be set that the first electrodes 1201 are discrete and the second electrodes 1202 are also discrete.

Optionally, the first electrode 1201 of the fingerprint identification unit 120 is disposed in a same layer as the anode 110A of the light-emitting unit 110, and the second electrode 1202 of the fingerprint identification unit 120 is disposed in a same layer as the cathode 110C of the light-emitting unit 110. Therefore, each light-emitting unit 110 and each fingerprint identification unit 120 are sequentially arranged on a plane where the first substrate is located rather than being sequentially arranged in a direction perpendicular to the plane where the first substrate is located. That is, it is unnecessary to separately dispose the first electrode 1201 and the second electrode 1202 of the fingerprint identification unit 120 outside the film layer of the light-emitting unit 110, which reduces the overall thickness of the display panel 01 and facilitates the lightening and thinning of the display panel 01.

Optionally, the first electrode 1201 and the anode 110A are formed in a same process by using the same materials. Compared with the scheme in which the first electrode 1201 and the anode 110A are separately formed in different processes, such an arrangement only requires one etching process in the fabrication process, and masks are not separately needed for the first electrode 1201 and the anode 110A, which saves costs, reduces the number of processes and improves fabrication efficiency.

Optionally, the second electrode 1202 and the cathode 110C are formed in a same process by using the same materials. Compared with the scheme in which the second electrode 1202 and the cathode 110C are separately formed in different processes, such an arrangement only requires one etching process in the fabrication process, and masks are not separately needed for the second electrode 1202 and the cathode 110C, which saves costs, reduces the number of processes and improves fabrication efficiency.

Figure 3:
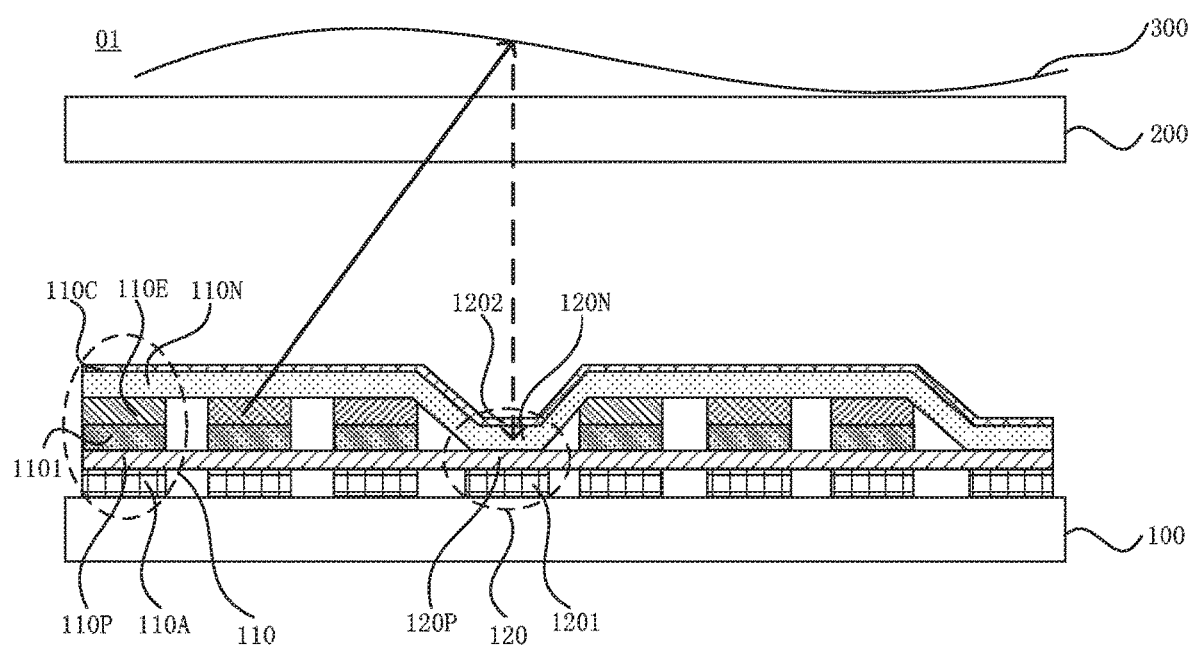
FIG. 3 is a structural diagram of another display panel according to an embodiment of the present disclosure.

FIG. 3 is a structural diagram of another display panel according to an embodiment of the present disclosure. Compared with FIG. 2, in the display panel in FIG. 3, the light-emitting unit further includes a first optical compensation layer 1101. Referring to FIG. 3, the first optical compensation layer 1101 is located between the first light-emitting layer 110E and the anode 110A. The first optical compensation layer 1101 may employ materials with a higher hole mobility to improve the injection or transmission efficiency of holes, thereby improving a display effect of the display panel. Optionally, the first optical compensation layer 1101 may include a hole injection layer and/or a hole transport layer.

Alternatively, it may also be set that the light-emitting unit 110 further includes a second optical compensation layer. The second optical compensation layer is located between the first light-emitting layer 110E and the cathode 11C (not shown in FIG. 3). The second optical compensation layer may employ materials with a higher electron mobility to improve the injection or transmission efficiency of electrons, thereby improving the display effect of the display panel.

Optionally, the second optical compensation layer may include an electron injection layer and/or an electron transport layer.

Furthermore, it may be set according to practical needs that in the light-emitting units which emit different colors of light, the first optical compensation layers 1101 or the second optical compensation layers have different thicknesses to adjust a microcavity effect so that the first light-emitting layers 110E emit light at a frequency near an enhanced peak of a standing wave field in the microcavity. Exemplarily, the first light-emitting layers 110E emit light at a frequency coinciding with a peak of a microcavity standing wave, or the first light-emitting layers 110E emit light at a frequency coinciding with a trough of the microcavity standing wave.

Figure 4:
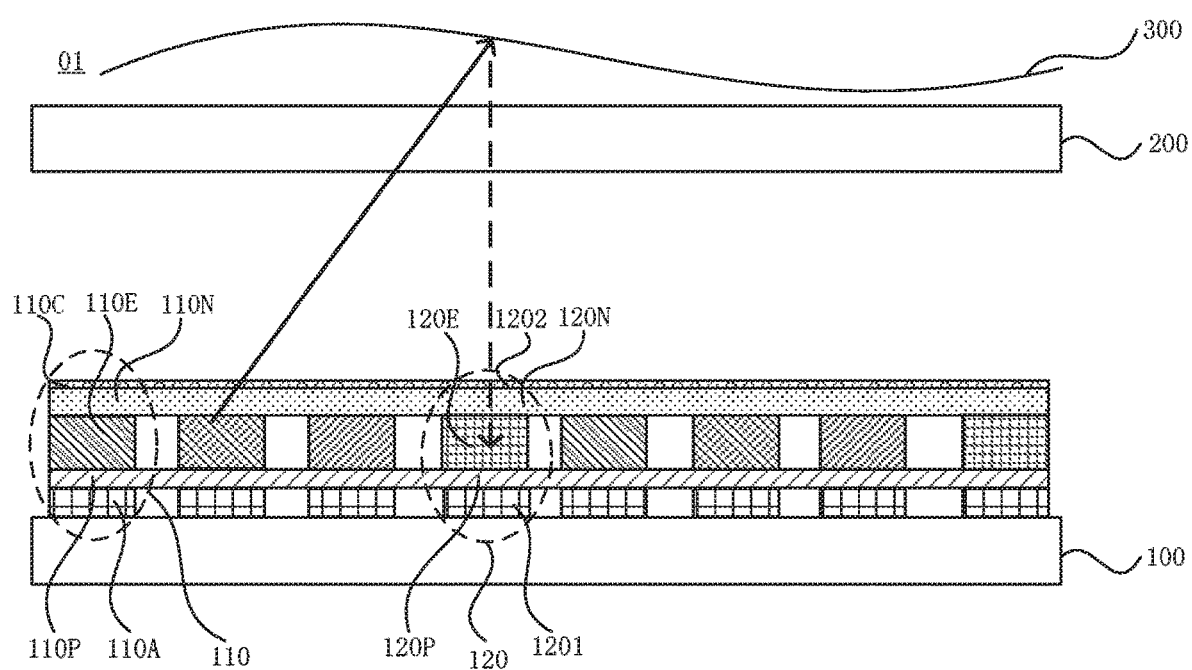
FIG. 4 is a structural diagram of another display panel according to an embodiment of the present disclosure.

FIG. 4 is a structural diagram of another display panel according to an embodiment of the present disclosure. Referring to FIG. 4, each of the plurality of fingerprint identification units 120 may further include a second light-emitting layer 120E. The second light-emitting layer 120E is disposed between the second P-type semiconductor 120P and the second N-type semiconductor 120N.

The overall structure of the fingerprint identification unit 120 may still be regarded as a structure of an organic photovoltaic cell and may still implement the fingerprint identification function with a photo-generated carrier effect.

Figure 5:
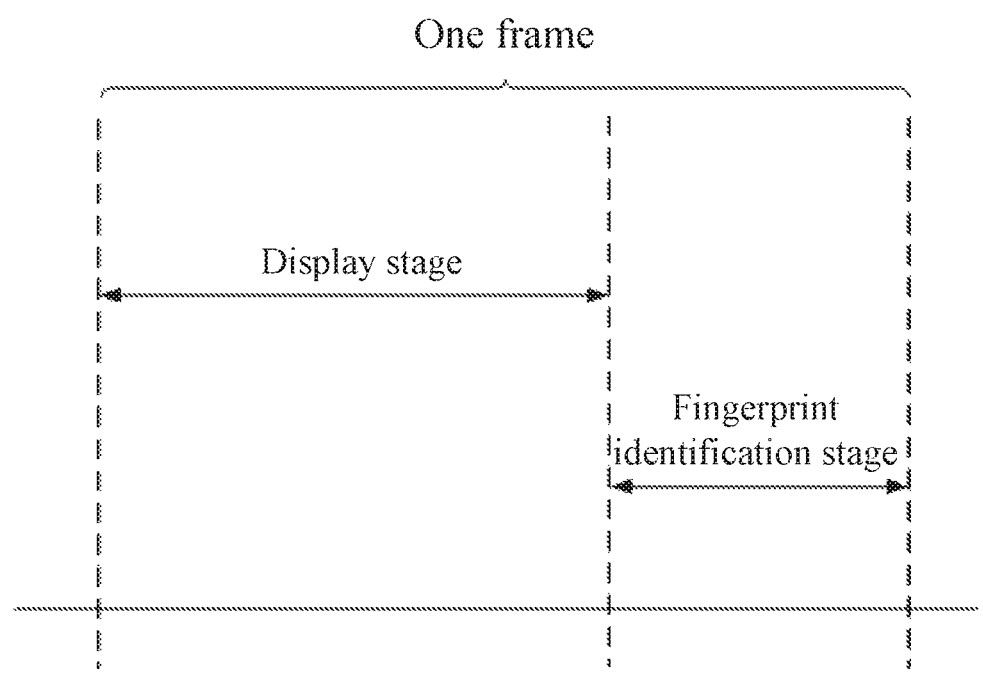
FIG. 5 is a schematic diagram of a driving cycle according to an embodiment of the present disclosure.

FIG. 5 is a schematic diagram of a driving cycle according to an embodiment of the present disclosure. Referring to FIG. 5, a working process of the display panel 01 may include a fingerprint identification stage and a display stage. In the fingerprint identification stage, the fingerprint identification unit 120 is configured to perform fingerprint identification. In the display stage, the fingerprint identification unit 120 is configured to perform image display.

Exemplarily, the display panel may further include a touch position detection unit and/or a touch pressure detection unit and a control circuit. When the touch position detection unit detects a touch of a touch body, the display panel is controlled to be in the fingerprint identification stage and the control circuit sends a first electrical signal to the fingerprint identification unit 120 to control the fingerprint identification unit 120 to perform fingerprint identification. When the touch position detection unit does not detect the touch of the touch body, the display panel is controlled to be in the display phase and the control circuit sends a second electrical signal to the fingerprint identification unit 120 to control the fingerprint identification unit 120 to perform the image display. It is exemplarily set in FIG. 5 that the fingerprint identification is performed after the display, but this is not to limit the display panel provided by the embodiments of the present disclosure. In another embodiment, it may also be set that the fingerprint identification is performed before the display.

In one embodiment, a second light-emitting layer 120E may emit red, blue, green, white, yellow or orange light.

In the display stage, when the second light-emitting layer 120E emits white light, the fingerprint identification unit 120 is used for brightness compensation of the display panel 01; when the second light-emitting layer 120E emits yellow or orange light, the fingerprint identification unit 120 is used for chromaticity compensation of the display panel 01.

In one embodiment, in the display phase, according to different images to be displayed, a part of fingerprint identification units 120 may be configured for display and the rest of fingerprint identification units 120 do not work to ensure that the display panel has better display quality and meanwhile saves electrical power.

Figure 6:
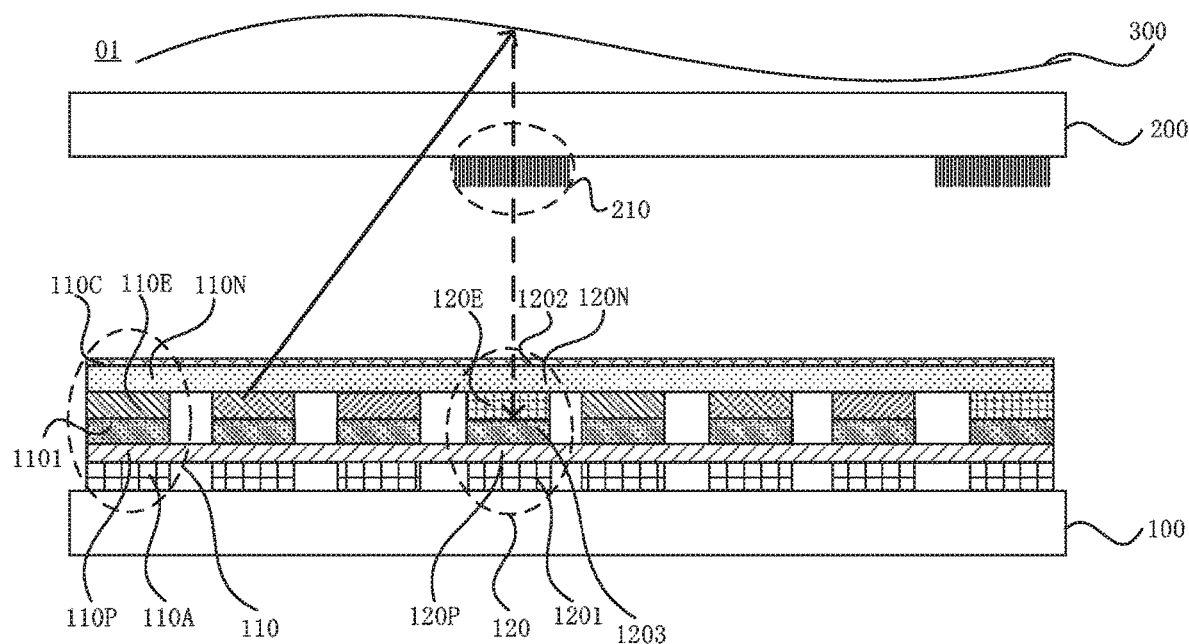
FIG. 6 is a structural diagram of another display panel according to an embodiment of the present disclosure.

FIG. 6 is a structural diagram of another display panel according to an embodiment of the present disclosure. Compared with FIG. 4, in the display panel 01 in FIG. 6, the fingerprint identification unit 120 may further include a third optical compensation layer 1203. Referring to FIG. 6, the third optical compensation layer 1203 is disposed between a second light-emitting layer 120E and a first electrode 1201. The third optical compensation layer 1203 may employ materials with a higher hole mobility to improve the injection or transmission efficiency of holes, thereby improving a display effect of the display panel. Optionally, the third optical compensation layer 1203 may include a hole injection layer and/or a hole transport layer.

Alternatively, it may also be set that the fingerprint identification unit 120 further includes a fourth optical compensation layer. The fourth optical compensation layer is disposed between the second light-emitting layer 120E and a second electrode 1202 (not shown in FIG. 6). The fourth optical compensation layer may employ materials with a higher electron mobility to improve the injection or transmission efficiency of electrons, thereby improving the display effect of the display panel. In one embodiment, the fourth optical compensation layer may include an electron injection layer and/or an electron transport layer.

Furthermore, it may be set according to practical needs that in the light-emitting units which emit different colors of light, the third optical compensation layers 1203 or the fourth optical compensation layers have different thicknesses to adjust a microcavity effect so that the second light-emitting layers 120E are located near an enhanced peak of a standing wave field in the microcavity. Exemplarily, the second light-emitting layers 120E coincide with a peak of a microcavity standing wave, or the second light-emitting layers 120E coincide with a trough of the microcavity standing wave.

Figure 7:
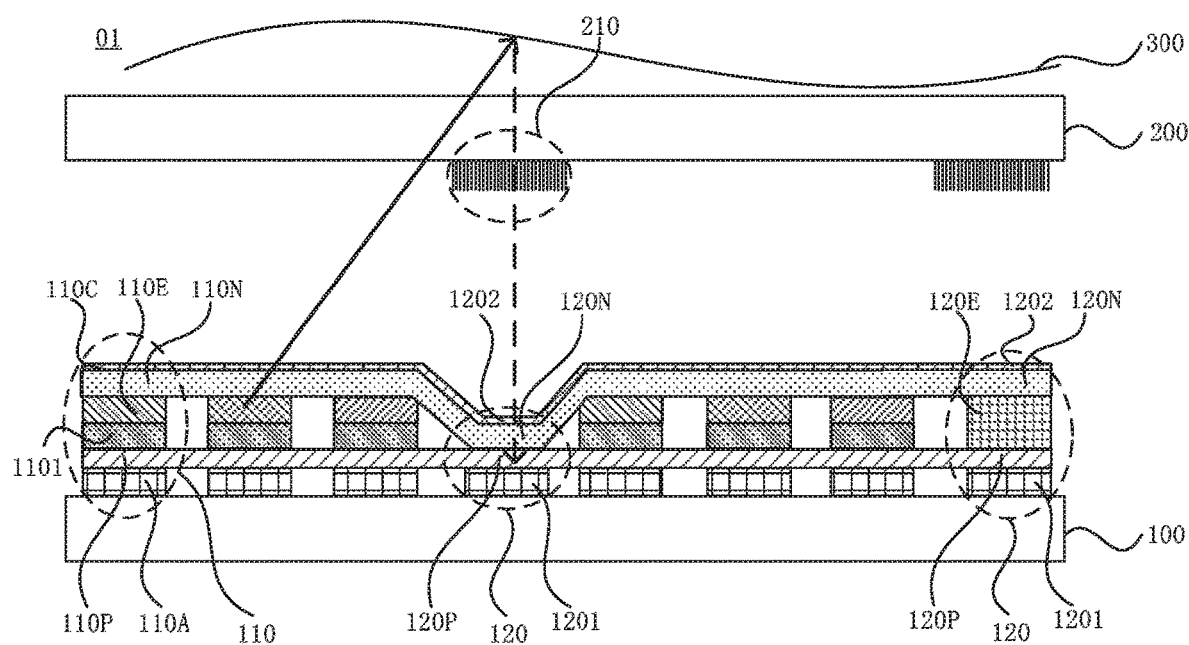
FIG. 7 is a structural diagram of another display panel according to an embodiment of the present disclosure.

In one embodiment, FIG. 7 is a structural diagram of another display panel according to an embodiment of the present disclosure. Referring to FIG. 7, in the same display panel 01, it may be set that the film layer structures of some fingerprint identification units 120 include a second light-emitting layer 120E, and the film layer structures of some fingerprint identification units 120 do not include the second light-emitting layer 120E.

In each of the above embodiments, the display panel further includes a fingerprint identification light source. Light emitted by the fingerprint identification light source is reflected by the touch body, forming reflected light incident into the fingerprint identification unit to perform fingerprint identification. In practice, as illustrated in FIGS. 2 to 7, at least some light-emitting units 110 are disposed as the fingerprint identification light source. Light emitted by the light-emitting unit 110 is reflected by the touch body 300, forming reflected light incident into the fingerprint identification unit 120 to perform fingerprint identification. Alternatively, an external fingerprint identification light source is disposed in the display panel.

By providing at least some light-emitting units 110 as the fingerprint identification light source, an extra fingerprint identification light source is not required to be configured, thereby further simplifying the structure of the display panel 01 and decreasing the thickness and manufacturing difficulty of the display panel.

If an external fingerprint identification light source is to be disposed in the display panel, optionally, the fingerprint identification light source is an infrared light source. An advantage of such an arrangement is that the infrared light source and the light-emitting unit 110 emit different bands of light so that the image display function and the fingerprint identification function of the display panel 01 do not affect each other, thereby improving image display quality of the display panel 01 and an accuracy of fingerprint identification.

On the basis of the above technical solutions, optionally, the display panel may further include a plurality of light screening structures. Exemplarily, referring to FIG. 7, it is optional that the display panel 01 may further include a plurality of light screening structures 210. The plurality of light screening structures 210 are disposed on one side of the second substrate 200 facing to the first substrate 100, and a vertical projection of each of the plurality of fingerprint identification units 120 onto the first substrate 100 is located within a vertical projection of a respective one of the plurality of light screening structures 210 onto the first substrate 100.

Each light screening structure 210 includes a plurality of light screening channels perpendicular to the surface of the second substrate 200. Light parallel to the plurality of light screening channels may pass through the light screening structure 210 and be transmitted into the fingerprint identification unit 120. Light which is not parallel to the plurality of light screening channels is absorbed by the light screening structure 210 to avoid interference caused by that light emitted by the fingerprint identification light source which is irradiated onto the same fingerprint identification unit 120 after being reflected by different positions of the touch body, thereby improving the accuracy of fingerprint identification.

It is to be noted that only two light screening structures 210 are exemplarily shown in the embodiments of the present disclosure, but this is not to limit the display panel 01 provided by the present disclosure. In another embodiment, the number and location of the light screening structure 210 may be specifically set according to the number and location of the fingerprint identification unit 120.

Figure 8:
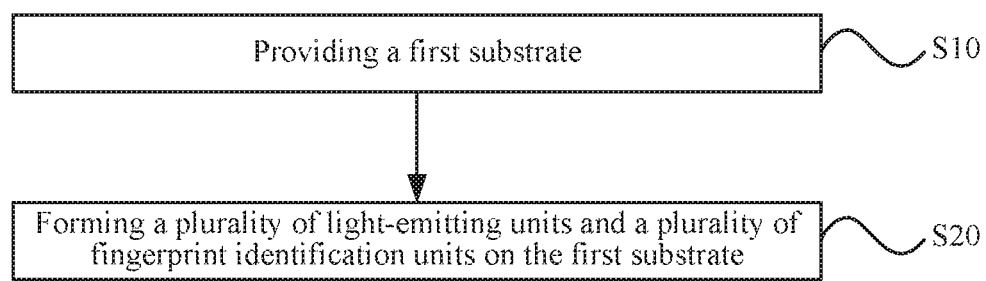
FIG. 8 is a flowchart illustrating a manufacturing method of a display panel according to an embodiment of the present disclosure.

FIG. 8 is a flowchart illustrating a manufacturing method of a display panel according to an embodiment of the present disclosure. Referring to FIG. 8, the manufacturing method includes the steps described below.

In S10, a first substrate is provided.

The first substrate may be a rigid substrate or a flexible substrate. The materials of the first substrate are not specifically limited in the embodiments of the present disclosure.

In S20, a plurality of light-emitting units and a plurality of fingerprint identification units on the first substrate are formed.

Each of the plurality of light-emitting units includes a first N-type semiconductor layer and a first P-type semiconductor layer, each of the plurality of fingerprint identification units includes a second N-type semiconductor layer and a second P-type semiconductor layer, the first N-type semiconductor layer and the second N-type semiconductor layer are formed in a same film layer, and the first P-type semiconductor layer and the second P-type semiconductor layer are formed in a same film layer.

The P-type semiconductor layer and the N-type semiconductor layer may be formed in a physical film formation manner or in a chemical film formation manner, which is not limited in the embodiments of the present disclosure.

In the manufacturing method of the display panel provided by the embodiments of the present disclosure, the first P-type semiconductor layer of the light-emitting unit and the second P-type semiconductor layer of the fingerprint identification unit are disposed in the same layer, the first N-type semiconductor layer of the light-emitting unit and the second N-type semiconductor layer of the fingerprint identification unit are disposed in the same layer so that each light-emitting unit and each fingerprint identification unit are sequentially arranged on the plane where the first substrate is located rather than that each light-emitting unit and each fingerprint identification unit are sequentially arranged in a direction perpendicular to the plane where the first substrate is located. That is, it is unnecessary to separately dispose the fingerprint identification unit outside the film layer of the light-emitting unit, which solves the problem that an existing display panel employs an external fingerprint identification unit so that the overall thickness of the display panel is great and does not facilitate lightening and thinning of the display panel, reduces the overall thickness of the display panel and facilitates the lightening and thinning of the display panel.

Figure 9:
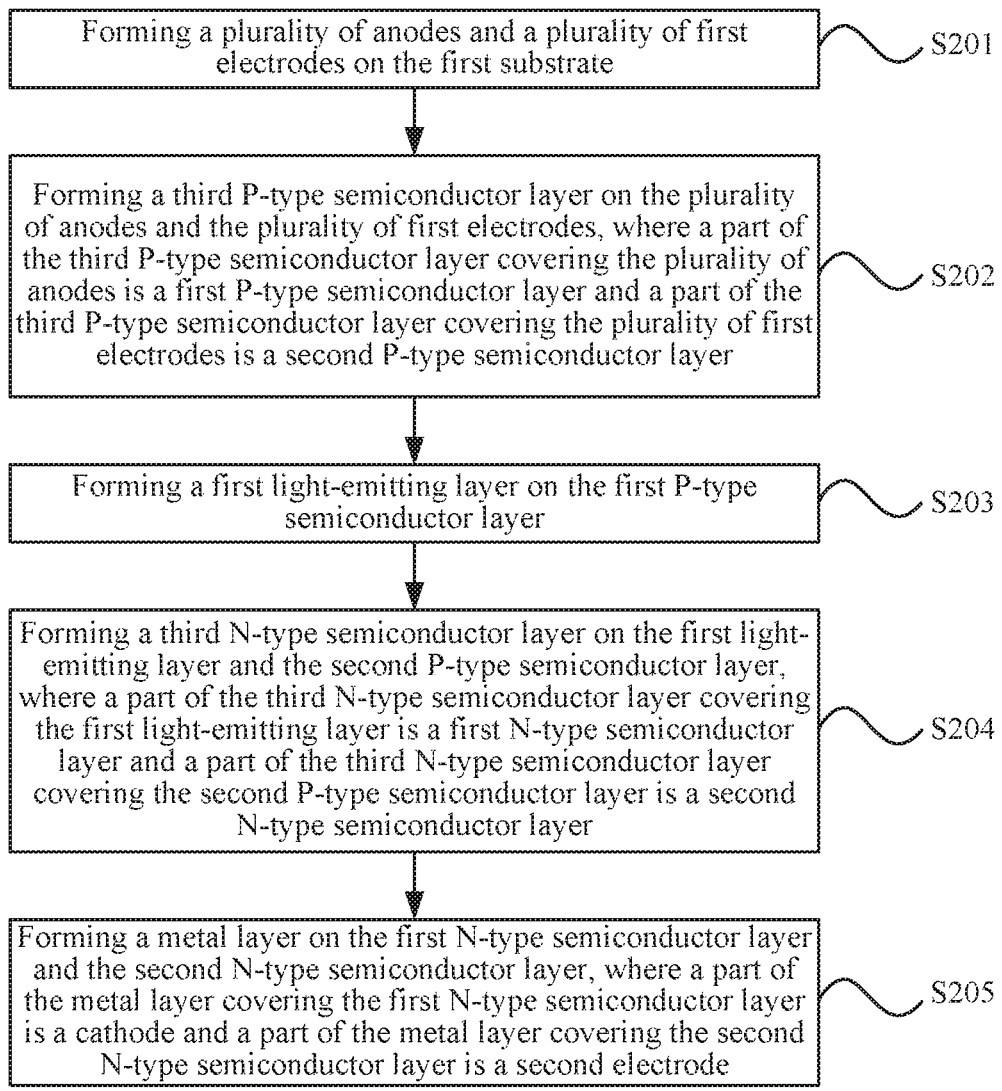
FIG. 9 is a flowchart illustrating a manufacturing method of another display panel according to an embodiment of the present disclosure.

FIG. 9 is a flowchart illustrating another manufacturing method of a display panel according to an embodiment of the present disclosure. FIG. 9 is an exemplary description of the step S20 in FIG. 8. Referring to FIG. 9, the step in which the plurality of light-emitting units and the plurality of fingerprint identification units are formed on the first substrate may include the steps described below.

In S201, a plurality of anodes and a plurality of first electrodes on the first substrate are formed.

Exemplarily, the anode of the light-emitting unit and the first electrode of the fingerprint identification unit are formed in a same process by using same materials. Compared with the scheme in which the anode and the first electrode are separately formed in different processes, such a structure only requires one evaporation process in the fabrication process, and masks are not separately needed for the first electrode and the anode, which saves costs, reduces the number of processes and improves fabrication efficiency.

In S202, a third P-type semiconductor layer is formed on the plurality of anodes and the plurality of first electrodes, where a part of the third P-type semiconductor layer covering the plurality of anodes is a first P-type semiconductor layer and a part of the third P-type semiconductor layer covering the plurality of first electrodes is a second P-type semiconductor layer.

Exemplarily, the first P-type semiconductor layer of the light-emitting unit and the second P-type semiconductor layer of the fingerprint identification unit are formed in a same process by using the same materials. Compared with the scheme in which the first P-type semiconductor layer and the second P-type semiconductor layer are separately formed in different processes, such a structure only requires one etching process in the fabrication process, and masks are not separately needed for the first P-type semiconductor layer and the second P-type semiconductor layer, which saves costs, reduces the number of processes and improves fabrication efficiency.

In S203, a first light-emitting layer is formed on the first P-type semiconductor layer.

Exemplarily, if the first light-emitting layer includes different light-emitting materials, a corresponding light-emitting unit may emit different colors of light.

In S204, a third N-type semiconductor layer is formed on the first light-emitting layer and the second P-type semiconductor layer, where a part of the third N-type semiconductor layer covering the first light-emitting layer is a first N-type semiconductor layer and a part of the third N-type semiconductor layer covering the second P-type semiconductor layer is a second N-type semiconductor layer.

Exemplarily, the first N-type semiconductor layer of the light-emitting unit and the second N-type semiconductor layer of the fingerprint identification unit are formed in a same process by using same materials. Compared with the scheme in which the first N-type semiconductor layer and the second N-type semiconductor layer are separately formed in different processes, such a structure only requires one etching process in the fabrication process, and masks are not separately needed for the first N-type semiconductor layer and the second N-type semiconductor layer, which saves costs, reduces the number of processes and improves fabrication efficiency.

It is to be noted that specific materials and specific formation manners of the P-type semiconductor layer and the N-type semiconductor layer are not limited in the embodiments of the present disclosure.

In S205, a metal layer is formed on the first N-type semiconductor layer and the second N-type semiconductor layer, where a part of the metal layer covering the first N-type semiconductor layer is a cathode and a part of the metal layer covering the second N-type semiconductor layer is a second electrode.

Exemplarily, the cathode of the light-emitting unit and the second electrode of the fingerprint identification unit are formed in a same process by using same materials. Compared with the scheme in which the second electrode and the cathode are separately formed in different processes, such a structure only requires one etching process in the fabrication process, and masks are not separately needed for the second electrode and the cathode, which saves costs, reduces the number of processes and improves fabrication efficiency.

Exemplarily, the metal layer may be made of conductive metal materials such as gold, silver or copper. The metal layer may be formed in a physical film formation manner or in a chemical film formation manner. Specific materials and specific formation manners of the metal layer are not limited in the embodiments of the present disclosure.

In the manufacturing method of the display panel provided by the embodiments of the present disclosure, the first electrode of the fingerprint identification unit and the anode of the light-emitting unit are formed in the same process, the second N-type semiconductor layer of the fingerprint identification unit and the first N-type semiconductor layer of the light-emitting unit are formed in the same process, the second P-type semiconductor layer of the fingerprint identification unit and the first P-type semiconductor layer of the light-emitting unit are formed in the same process, and the second electrode of the fingerprint identification unit and the cathode of the light-emitting unit are formed in the same process so that each light-emitting unit and each fingerprint identification unit are sequentially arranged on the plane where the first substrate is located rather than that each light-emitting unit and each fingerprint identification unit are sequentially arranged in a direction perpendicular to the plane where the first substrate is located. That is, it is unnecessary to separately dispose the fingerprint identification unit outside the film layer of the light-emitting unit, which solves the problem that an existing display panel employs an external fingerprint identification unit so that the overall thickness of the display panel is great and does not facilitate lightening and thinning of the display panel, reduces the overall thickness of the display panel and facilitates the lightening and thinning of the display panel. Meanwhile, masks are not needed for each film layer of the light-emitting unit and the fingerprint identification unit, which saves costs, reduces the number of processes and improves fabrication efficiency.

Figure 10:
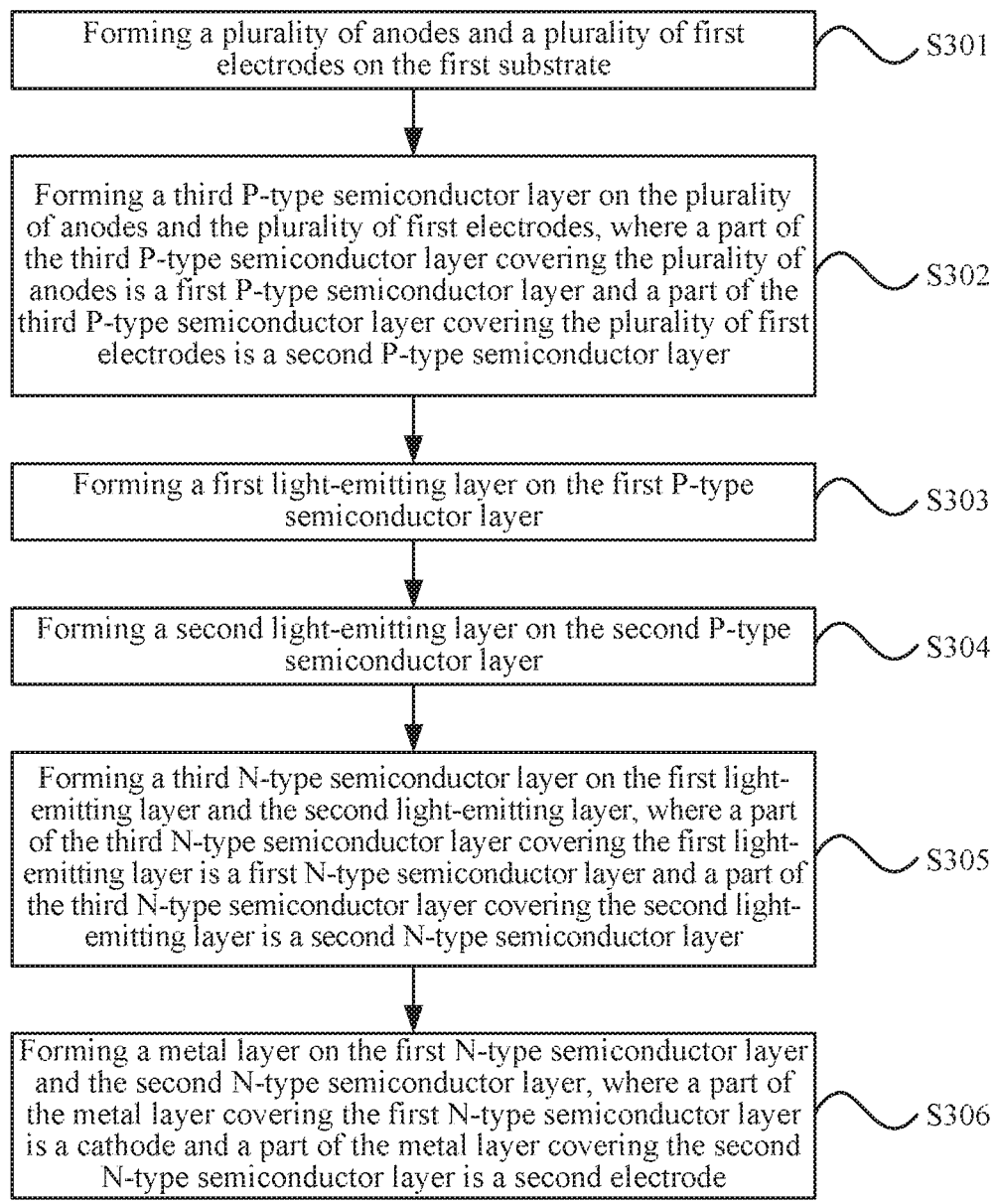
FIG. 10 is a flowchart illustrating a manufacturing method of another display panel according to an embodiment of the present disclosure.

FIG. 10 is a flowchart illustrating another manufacturing method of a display panel according to an embodiment of the present disclosure. FIG. 10 is another exemplary description of the step S20 in FIG. 8. Referring to FIG. 10, the step in which the plurality of light-emitting units and the plurality of fingerprint identification units are formed on the first substrate may include the steps described below.

In S301, a plurality of anodes and a plurality of first electrodes are formed on the first substrate.

In S302, a third P-type semiconductor layer is formed on the plurality of anodes and the plurality of first electrodes, where a part of the third P-type semiconductor layer covering the plurality of anodes is a first P-type semiconductor layer and a part of the third P-type semiconductor layer covering the plurality of first electrodes is a second P-type semiconductor layer.

In S303, a first light-emitting layer is formed on the first P-type semiconductor layer. The first light-emitting layer is used for forming the plurality of light-emitting units of the display panel.

In S304, a second light-emitting layer is formed on the second P-type semiconductor layer. The second light-emitting layer is used for forming the plurality of fingerprint identification units of the display panel.

The second light-emitting layer may emit red, green, blue, white, yellow or orange light.

In S305, a third N-type semiconductor layer is formed on the first light-emitting layer and the second light-emitting layer, where a part of the third N-type semiconductor layer covering the first light-emitting layer is a first N-type semiconductor layer and a part the third N-type semiconductor layer covering the second light-emitting layer is a second N-type semiconductor layer.

In S306, a metal layer is formed on the first N-type semiconductor layer and the second N-type semiconductor layer, where a part of the metal layer covering the first N-type semiconductor layer is a cathode and a part of the metal layer covering the second N-type semiconductor layer is a second electrode.

In the manufacturing method of the display panel provided by the embodiments of the present disclosure, the first electrode of the fingerprint identification unit and the anode of the light-emitting unit are formed in the same process, the second N-type semiconductor layer of the fingerprint identification unit and the first N-type semiconductor layer of the light-emitting unit are formed in the same process, the second P-type semiconductor layer of the fingerprint identification unit and the first P-type semiconductor layer of the light-emitting unit are formed in the same process, and the second electrode of the fingerprint identification unit and the cathode of the light-emitting unit are formed in the same process. Therefore, on one hand, each light-emitting unit and each fingerprint identification unit are sequentially arranged on the plane where the first substrate is located rather than that each light-emitting unit and each fingerprint identification unit are sequentially arranged in a direction perpendicular to the plane where the first substrate is located. That is, it is unnecessary to separately dispose the fingerprint identification unit outside the film layer of the light-emitting unit, which solves the problem that an existing display panel employs an external fingerprint identification unit so that the overall thickness of the display panel is great and does not facilitate lightening and thinning of the display panel, reduces the overall thickness of the display panel and facilitates the lightening and thinning of the display panel. On another hand, masks are not needed for each film layer of the light-emitting unit and the fingerprint identification unit, which saves costs, reduces the number of processes and improves fabrication efficiency. On another hand, the fingerprint identification unit provided by the embodiments of the present disclosure further includes a second light-emitting layer, to implement time division multiplexing of the fingerprint identification unit and improve an image display effect of the display panel.

Figure 11:
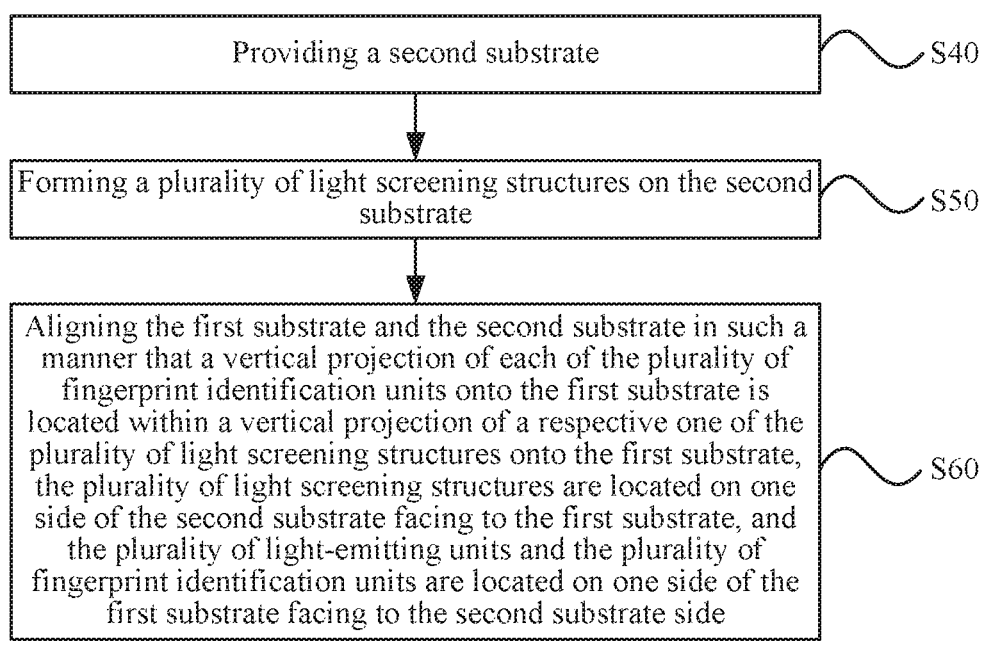
FIG. 11 is a flowchart illustrating a manufacturing method of another display panel according to an embodiment of the present disclosure.

FIG. 11 is a flowchart illustrating another manufacturing method of a display panel according to an embodiment of the present disclosure. Referring to FIG. 11, on the basis of any one of FIGS. 8 to 10, the manufacturing method of the display panel further includes the steps described below.

In S40, a second substrate is provided.

The second substrate may be a rigid substrate or a flexible substrate. The materials of the second substrate are not specifically limited in the embodiments of the present disclosure.

In S50, a plurality of light screening structures are formed on the second substrate.

The plurality of light screening structures are used for absorbing light which is not perpendicular to the surface of the second substrate and only allow light which is perpendicular to the surface of the second substrate to pass through. Specific materials and specific formation manners of the light screening structure are not limited in the embodiments of the present disclosure.

In S60, the first substrate and the second substrate are aligned in such a manner that a vertical projection of each of the plurality of fingerprint identification units onto the first substrate is located within a vertical projection of a respective one of the plurality of light screening structures onto the first substrate, the plurality of light screening structures are located on one side of the second substrate facing to the first substrate, and the plurality of light-emitting units and the plurality of fingerprint identification units are disposed on one side of the first substrate facing to the second substrate side.

Such an arrangement may avoid interference caused by that light emitted by the fingerprint identification light source is irradiated onto the same fingerprint identification unit 120 after being reflected by different positions of the touch body, thereby improving the accuracy of fingerprint identification.

Figure 12:
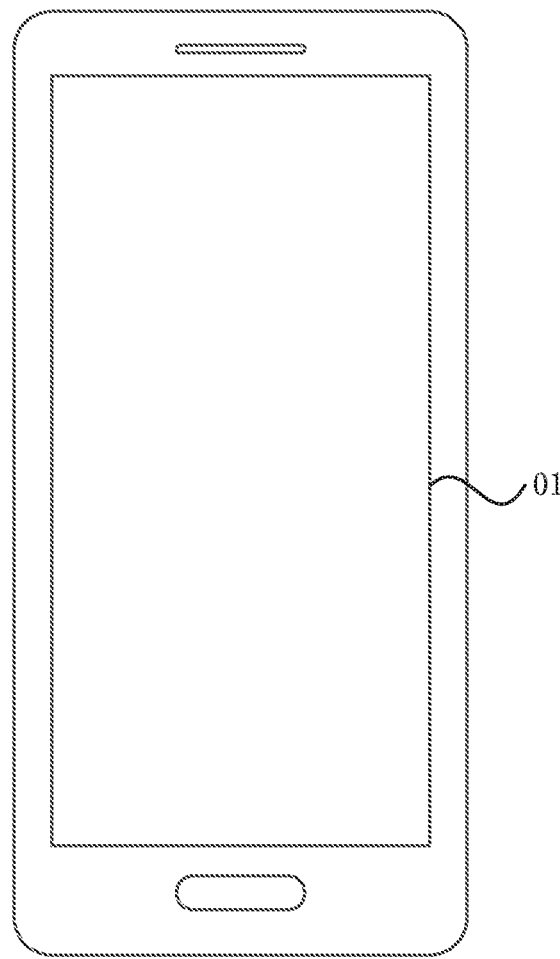
FIG. 12 is a structural diagram of a display device according to an embodiment of the present disclosure.

The present disclosure further provides a display device. Exemplarily, FIG. 12 is a structural diagram of a display device according to an embodiment of the present disclosure. Referring to FIG. 12, the display device 02 includes the display panel 01 described above.

Exemplarily, the display device 02 may include a mobile phone, a computer and a smart wearable device etc., and no special limitations are made thereto in the embodiments of the present disclosure.

In the display device provided by this embodiment, in the display panel, the first N-type semiconductor layer of the light-emitting unit and the second N-type semiconductor layer of the fingerprint identification unit are disposed in the same layer, the first P-type semiconductor layer of the light-emitting unit and the second P-type semiconductor layer of the fingerprint identification unit are disposed in the same layer so that each light-emitting unit and each fingerprint identification unit are sequentially arranged on the plane where the first substrate is located rather than that each light-emitting unit and each fingerprint identification unit are sequentially arranged in a direction perpendicular to the plane where the first substrate is located. That is, it is unnecessary to separately dispose the fingerprint identification unit 120 outside the film layer of the light-emitting unit 110, which solves the problem that an existing display panel employs an external fingerprint identification unit so that the overall thickness of the display panel is great and does not facilitate lightening and thinning of the display panel, reduces the overall thickness of the display panel and facilitates the lightening and thinning of the display panel.

What is claimed is:

1. A display panel, comprising:
a first substrate and a second substrate disposed opposite to each other; and
a plurality of light-emitting units and a plurality of fingerprint identification units, disposed on one side of the first substrate facing to the second substrate; wherein each of the plurality of light-emitting units comprises a first N-type semiconductor layer and a first P-type semiconductor layer, each of the plurality of fingerprint identification units comprises a second N-type semiconductor layer and a second P-type semiconductor layer, the first N-type semiconductor layer and the second N-type semiconductor layer are disposed in a same layer, and the first P-type semiconductor layer and the second P-type semiconductor layer are disposed in a same layer.

2. The display panel of claim 1, wherein
the each of the plurality of light-emitting units further comprises an anode, a first light-emitting layer and a cathode which are sequentially stacked;
wherein the first P-type semiconductor layer is disposed between the anode and the first light-emitting layer;
the first N-type semiconductor layer is disposed between the first light-emitting layer and the cathode; and
the anode is disposed between the first substrate and the first light-emitting layer; or the cathode is disposed between the first substrate and the first light-emitting layer.

3. The display panel of claim 2, wherein
the each of the plurality of fingerprint identification units further comprises a first electrode and a second electrode;
the first electrode is disposed on one side of the second P-type semiconductor layer facing away from the second N-type semiconductor layer; and
the second electrode is disposed on one side of the second N-type semiconductor layer facing away from the second P-type semiconductor layer.

4. The display panel of claim 3, wherein
the first electrode of the each of the plurality of fingerprint identification units is disposed in a same layer as the anode of the each of the plurality of light-emitting units, and the second electrode of the each of the plurality of fingerprint identification units is disposed in a same layer as the cathode of the each of the plurality of light-emitting units.

5. The display panel of claim 3, wherein
the each of the plurality of fingerprint identification units further comprises a second light-emitting layer; and
the second light-emitting layer is disposed between the second P-type semiconductor layer and the second N-type semiconductor layer.

6. The display panel of claim 5, wherein
the second light-emitting layer emits white light.

7. The display panel of claim 5, wherein
a working process of the display panel comprises a fingerprint identification stage and a display stage; wherein
in the fingerprint identification stage, each of the plurality of fingerprint identification units is configured to perform fingerprint identification; and in the display stage, each of the plurality of fingerprint identification units is configured to perform image display.

8. The display panel of claim 1, further comprising: a fingerprint identification light source;
wherein light emitted by the fingerprint identification light source is reflected by a touch body, forming reflected light incident into each of the plurality of fingerprint identification units to perform fingerprint identification.

9. The display panel of claim 8, wherein
at least a part of the plurality of light-emitting units are employed as the fingerprint identification light source; and wherein
light emitted from the part of the plurality of light-emitting units is reflected by the touch body, forming reflected light incident into each of the plurality of fingerprint identification units to perform fingerprint identification.

10. The display panel of claim 8, wherein the fingerprint identification light source comprises an infrared light source.

11. The display panel of claim 1, further comprising: a plurality of light screening structures, wherein the plurality of light screening structures are disposed on one side of the second substrate facing to the first substrate, and a vertical projection of the each of the plurality of fingerprint identification units onto the first substrate is located within a vertical projection of a respective one of the plurality of light screening structures onto the first substrate.

12. A manufacturing method of a display panel, comprising:
providing a first substrate;
forming a plurality of light-emitting units and a plurality of fingerprint identification units on the first substrate, wherein each of the plurality of light-emitting units comprises a first N-type semiconductor layer and a first P-type semiconductor layer, each of the plurality of fingerprint identification units comprises a second N-type semiconductor layer and a second P-type semiconductor layer, wherein the first N-type semiconductor layer and the second N-type semiconductor layer are formed in a same film layer, and the first P-type semiconductor layer and the second P-type semiconductor layer are formed in a same film layer.

13. The manufacturing method of the display panel of claim 12, wherein the forming the plurality of light-emitting units and the plurality of fingerprint identification units on the first substrate comprises:
forming a plurality of anodes and a plurality of first electrodes on the first substrate;
forming a third P-type semiconductor layer on the plurality of anodes and the plurality of first electrodes, wherein a part of the third P-type semiconductor layer covering the plurality of anodes is a first P-type semiconductor layer and a part of the third P-type semiconductor layer covering the plurality of first electrodes is a second P-type semiconductor layer;
forming a first light-emitting layer on the first P-type semiconductor layer;
forming a third N-type semiconductor layer on the first light-emitting layer and the second P-type semiconductor layer, wherein a part of the third N-type semiconductor layer covering the first light-emitting layer is a first N-type semiconductor layer and a part of the third N-type semiconductor layer covering the second P-type semiconductor layer is a second N-type semiconductor layer; and forming a metal layer on the first N-type semiconductor layer and the second N-type semiconductor layer, wherein a part of the metal layer covering the first N-type semiconductor layer is a cathode and a part of the metal layer covering the second N-type semiconductor layer is a second electrode.

14. The manufacturing method of the display panel of claim 12, wherein the forming the plurality of light-emitting units and the plurality of fingerprint identification units on the first substrate comprises:
forming a plurality of anodes and a plurality of first electrodes on the first substrate;
forming a third P-type semiconductor layer on the plurality of anodes and the plurality of first electrodes, wherein a part of the third P-type semiconductor layer covering the plurality of anodes is a first P-type semiconductor layer and a part of the third P-type semiconductor layer covering the plurality of first electrodes is a second P-type semiconductor layer;
forming a first light-emitting layer on the first P-type semiconductor layer;
forming a second light-emitting layer on the second P-type semiconductor layer;
forming a third N-type semiconductor layer on the first light-emitting layer and the second light-emitting layer, wherein a part of the third N-type semiconductor layer covering the first light-emitting layer is a first N-type semiconductor layer and a part of the third N-type semiconductor layer covering the second light-emitting layer is a second N-type semiconductor layer; and
forming a metal layer on the first N-type semiconductor layer and the second N-type semiconductor layer, wherein a part of the metal layer covering the first N-type semiconductor layer is a cathode and a part of the metal layer covering the second N-type semiconductor layer is a second electrode.

15. The manufacturing method of the display panel of claim 12, further comprising:
providing a second substrate;
forming a plurality of light screening structures on the second substrate; and
aligning and attaching the first substrate to the second substrate in such a manner that a vertical projection of each of the plurality of fingerprint identification units onto the first substrate is located within a vertical projection of a respective one of the plurality of light screening structures onto the first substrate, the plurality of light screening structures are located on one side of the second substrate facing to the first substrate, and the plurality of light-emitting units and the plurality of fingerprint identification units are located on one side of the first substrate facing to the second substrate side.

16. A display device, comprising a display panel, wherein the display panel comprises:
a first substrate and a second substrate disposed opposite to each other; and
a plurality of light-emitting units and a plurality of fingerprint identification units, disposed on one side of the first substrate facing to the second substrate; wherein each of the plurality of light-emitting units comprises a first N-type semiconductor layer and a first P-type semiconductor layer, each of the plurality of fingerprint identification units comprises a second N-type semiconductor layer and a second P-type semiconductor layer, the first N-type semiconductor layer and the second N-type semiconductor layer are disposed in a same layer, and the first P-type semiconductor layer and the second P-type semiconductor layer are disposed in a same layer.

17. The display device of claim 16, wherein
the each of the plurality of light-emitting units further comprises an anode, a first light-emitting layer and a cathode which are sequentially stacked;
wherein the first P-type semiconductor layer is disposed between the anode and the first light-emitting layer;
the first N-type semiconductor layer is disposed between the first light-emitting layer and the cathode; and
the anode is disposed between the first substrate and the first light-emitting layer; or the cathode is disposed between the first substrate and the first light-emitting layer.

18. The display device of claim 17, wherein
the each of the plurality of fingerprint identification units further comprises a first electrode and a second electrode;
the first electrode is disposed on one side of the second P-type semiconductor layer facing away from the second N-type semiconductor layer; and
the second electrode is disposed on one side of the second N-type semiconductor layer facing away from the second P-type semiconductor layer.

19. The display device of claim 16, further comprising: a fingerprint identification light source; wherein
light emitted by the fingerprint identification light source is reflected by a touch body, forming reflected light incident into each of the plurality of fingerprint identification units to perform fingerprint identification.

20. The display device of claim 16, further comprising: a plurality of light screening structures, wherein the plurality of light screening structures are disposed on one side of the second substrate facing to the first substrate, and a vertical projection of the each of the plurality of fingerprint identification units onto the first substrate is located within a vertical projection of a respective one of the plurality of light screening structures onto the first substrate.

* * * * *